United States Patent
Gentsch et al.

(10) Patent No.: US 7,330,706 B2
(45) Date of Patent: Feb. 12, 2008

(54) METHOD AND SYSTEM FOR POWER CONTROL IN RADIO TRANSMITTERS

(75) Inventors: Morten Brok Gentsch, Aalborg (DK); Hans Christian Henningsen, Saltum (DK); Bjarne Moller-Jensen, Aalborg (DK); Per Vinther Jensen, Aalborg (DK)

(73) Assignee: Siemens Aktiengesellschaft, Munich (DE)

( * ) Notice: Subject to any disclaimer, the term of this patent is extended or adjusted under 35 U.S.C. 154(b) by 524 days.

(21) Appl. No.: 10/661,992

(22) Filed: Sep. 11, 2003

(65) Prior Publication Data

US 2004/0137861 A1 Jul. 15, 2004

(30) Foreign Application Priority Data

Sep. 11, 2002 (EP) .................. 02020320

(51) Int. Cl.
*H04B 1/04* (2006.01)
(52) U.S. Cl. .................. 455/127.1; 455/522; 375/300; 375/305; 375/308
(58) Field of Classification Search .............. 455/522, 455/69, 127.1; 370/318; 375/268, 269, 375/274, 300, 305, 308
See application file for complete search history.

(56) References Cited

U.S. PATENT DOCUMENTS 6,670,849 B1 * 12/2003 Damgaard et al. .......... 330/129

FOREIGN PATENT DOCUMENTS

EP 0 688 109 A2 12/1995
WO WO 00/33477 6/2000

OTHER PUBLICATIONS

3GPP TS 45.005 v5.2.0, Nov. 2001, 3r~ Generation Partnership Project; Technical Specification Group GSM/EDGE Radio Access Network; Radio Transmission and Reception, Release 5.*

* cited by examiner

*Primary Examiner*—Edward F. Urban
*Assistant Examiner*—Raymond S. Dean
(74) *Attorney, Agent, or Firm*—Bell, Boyd & Lloyd LLP

(57) ABSTRACT

A method and system are provided for power control in radio transceivers wherein an amplifier amplifies a signal including data bursts. A signal corresponding to the amplified signal is compared with a reference value and if the result of the comparison shows that the signal corresponding to the amplified signal differs more than a predefined threshold value from the reference value, a control signal of the amplifier is adjusted by a controller of the system. The signal corresponding to the amplified signal is select by a time window from a first data burst, and the controller is adapted to adjust the control signal of the amplifier after a predetermined delay to have an effect from the beginning of a subsequent data burst. This is particularly useful when the data bursts in question also include an amplitude modulation part because it saves a great deal of processing in getting an average value of the power.

21 Claims, 5 Drawing Sheets

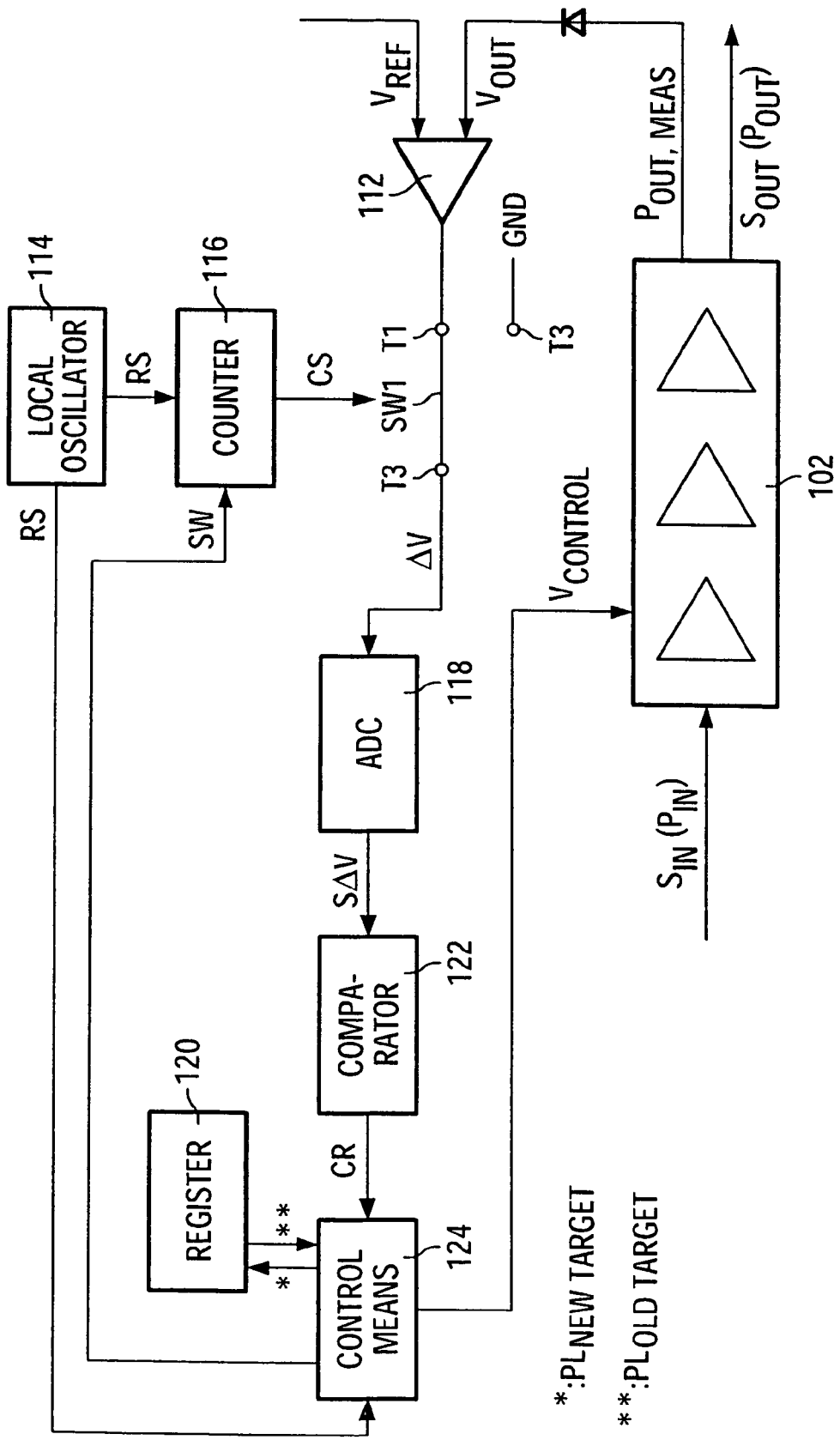

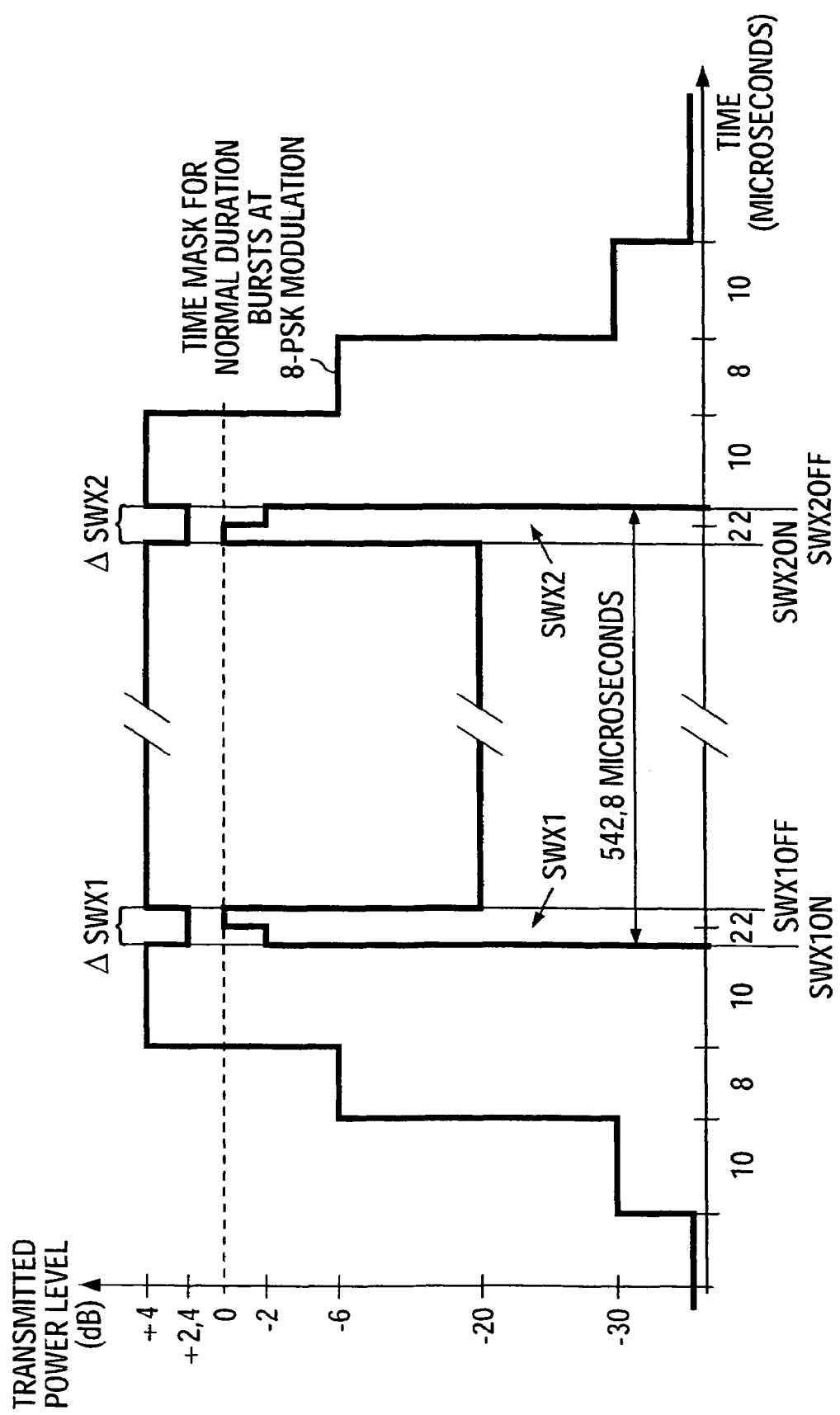

METHOD AND SYSTEM FOR POWER CONTROL IN RADIO TRANSMITTERS

BACKGROUND OF THE INVENTION

The present invention relates, generally, to power control in radio transmitters and, more particularly, to transmitters used in telecommunications systems, such as used in mobile terminals.

Because the number of users of mobile terminals has increased tremendously, there have been increased efforts to increase the capacity of mobile networks. As one possible solution, the Code Division Multiple Access (CDMA) technology has been under discussion for years. In Europe, the UMTS research work has mostly concentrated on the wide band CDMA technology. On the other hand, there also has been a multitude of other research efforts relating to further development of the already existing Global System for Mobile communications (GSM) technologies. For example, Enhanced Data rates for GSM Evolution (EDGE) is currently coming to market.

In the GSM, the Gaussian Minimum Shift Keying (GMSK) modulation is used. On the contrary, in the EDGE, the 8PSK modulation scheme will be used. A remarkable difference between these two modulation schemes is that the 8PSK modulation is a nonconstant envelope modulation scheme, whereas the GMSK is a constant envelope modulation scheme. As such, that in the 8PSK modulation, some part of the information is contained in the amplitude of the envelope of the transmitted signal and some part is contained in the phase of the transmitted signal. The amplitude modulation makes it more difficult to control the power of the transmitter. The main reason for the difficulty is that the varying amplitude causes variations in the peak signal power. The amplitude depends on the signals that are sent, and the peak power varies between time slots or data bursts that are sent with the same average output power.

Some solutions for controlling the power output of a radio frequency transmitter can be found in prior art. The European patent application 0 688 109 A2 describes an output power control arrangement for a burst transmitter. In '109, the idea is that the output power envelope shaping of the prior burst to be transmitted is controlled in a feedback loop producing a control signal. When the signal is to be transmitted using amplitude modulation, the feedback loop is switched off for the period of information transfer, but closed at other times. Conversely, for bursts to be transmitted with a constant envelope modulation the loop is not switched off.

International patent application WO 00/33477 presents a peak to average power ratio limiting apparatus to be used in a CDMA network. Because the air-interface bandwidth is shared between multiple users, the compound signals may have high peaks to average power ratio to be processed by the transceiver. Because compound signals are input to the power amplifier of a mobile terminal, the amplifier usually has a poor power efficiency. In '477, the system has a squared envelope magnitude predictor equivalent to a power estimation apparatus that estimates the squared magnitude of the modulated CDMA waveform envelope. The envelope is finally formed by the base band signal after quadruple modulation. The predicting requires excessive averaging in order to find the average power through the burst, which results in a narrow resolution bandwidth.

A third prior art power output control system is presented in published UK patent application GB 2 368 208 A. The system measures information relating to statistical variations in the amplitude of the information signal to be transmitted. The statistical variations are used to control a gain value of the radio frequency transmitter. The statistical amplitude variation of the non-constant envelope modulation is taken into account and compensated. This requires excessive computation as well.

It is an object of the present invention, therefore, to provide a solution by which it is possible to bring about a system with which the output power of a radio transmitter can be controlled in a simple and reliable manner and the component count reduced by use of software control.

SUMMARY OF THE INVENTION

This is accomplished in accordance with the principles of the present invention by providing a method or a system for controlling the power of the radio transmitter as described herein.

A power control system for a radio transmitter includes i) an amplifier for amplifying a signal to an amplified signal, the signal including data bursts, ii) parts for obtaining a voltage corresponding to the power of the amplified signal, iii) a comparator for comparing the voltage with a reference voltage, adapted to produce a comparison result, and iv) a controller responsive to the comparator adapted to adjust a control signal of the amplifier if the comparing result shows that the voltage representing the power of the amplified signal deviates more than a predefined threshold value from the reference voltage. Further, the system includes time masking capabilities adapted to measure the voltage, in at least one time window with a predefined length, of a first data burst to be used in the comparator. In the system, the controller is adapted to set the control signal of the amplifier after a predetermined time delay, after the time window has lapsed. The proposed system solves problems with power detection in EDGE and other non-constant envelope system.

A method for power control in a radio transmitter includes the steps of i) amplifying a signal to an amplified signal, the amplified signal including data bursts, ii) measuring a voltage, the voltage corresponding to the output power of the output signal, iii) comparing the voltage with a reference voltage, the comparison producing a comparison result, iv) in response to the comparing step, adjusting a control signal which is used in adjusting the amplifying step, if the result of the comparison step is that the voltage corresponding to the output power of the signal produced in the amplifying step deviates more than a predefined threshold value from the reference voltage, and v) selecting at least one time window with a predefined length for a data burst for measuring the voltage. The adjusting step is adapted to adjust the control signal after a predetermined time delay. The proposed method solves problems with power detection in EDGE and other non-constant envelope system.

Additional features and advantages of the present invention are described in, and will be apparent from, the following Detailed Description of the Invention and the Figures.

BRIEF DESCRIPTION OF THE FIGURES

FIG. 1 illustrates the power control circuit to be used for controlling the output power of the amplifier.

FIG. 4 shows a time mask used for an 8PSK modulation data burst.

DETAILED DESCRIPTION OF THE INVENTION

Figure 3:
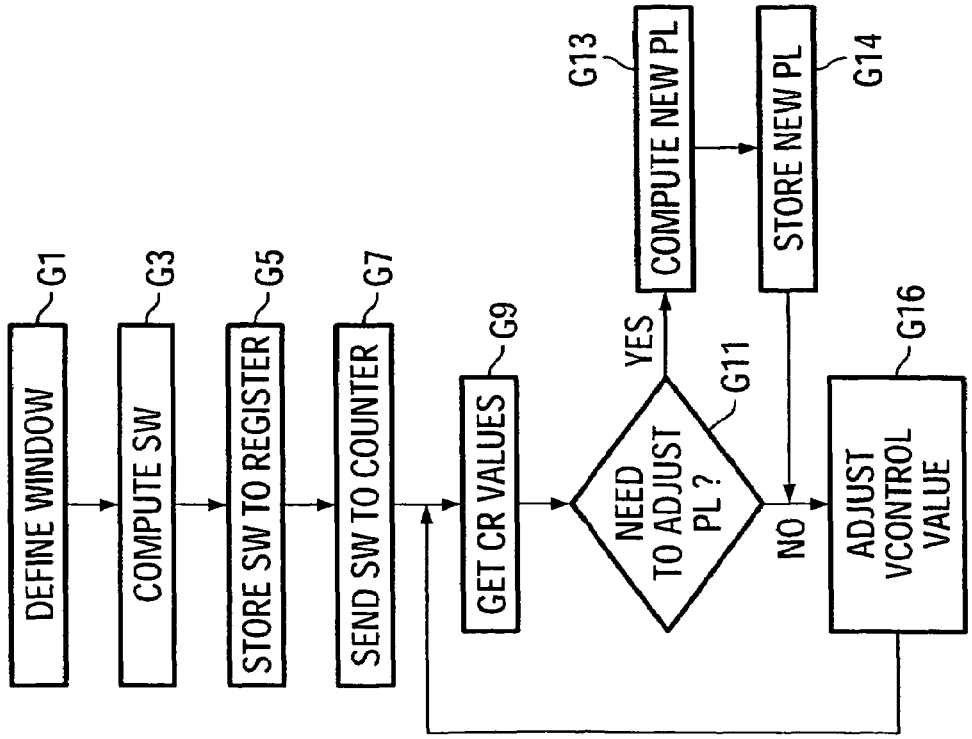
FIG. 3 is a flow diagram illustrating the operation of the system timer 116.

FIG. 4 shows a schematic presentation of a burst template of the EDGE 8PSK modulation. For the time axis, the figures under the axis correspond to the duration of each state of the burst in microseconds. When the burst is switched on at zero time, the transmitter power ramps up. The first and last 28 .mu.s is for ramping up and down respectively. The actual sending of the payload data of the burst begins 28 .mu.s after the beginning (T=0) of the burst, and has a duration of 542.8 .mu.s. As specified in the specification 3GPP TS 45.005 V5.2.0 (Third Generation Partnership Project; Technical Specification Group; GSM/Edge Radio Access Network: Radio Transmission and Reception), a specific time interval lasting a total of 4 .mu.s is defined for the envelope.

During the length ΔSWX1 of the time window SWX1, the modulation for both 8PSK and GMSK is substantially constant envelope modulation because of the tail symbols. Therefore, the position of sensing power does not need to be changed between different modulations. As already noted, getting an average value of the power during an EDGE burst would take too much processing power from the terminal equipment, or require different loop bandwidths, one for ramping and one for averaging the data part of the burst.

According to one embodiment of the present invention, a time window SWX1 is selected to correspond to the time interval between SWX10N to SWX10FF. Similarly, another time window SWX2 with length ΔSWX2 between SWX20N and SWXOFF can be selected. These windows corresponds to the tail bits, the bits being sent in a constant envelope. The benefit of using two windows is that if the output power is dropping through the burst, a second window at the down ramp is necessary for detecting and compensating for it. Such dropping of the power during the burst can be anything from the power amplifier and after the amplifier 102.

The transmitted power level at these moments of time should, according to the specification TS 45.005 referred above, equal to 2.4 dB. The voltage $V_{out}$ observed when the amplifier 102 is detected to transmit some signal $S_{out}$ with a correct power level $P_{out}$ is selected to present the reference voltage $V_{ref}$.

The 4 μs long sample comes from the ETSI 45.005 specification, which defines the 2+2 μs period before the modulation becomes evident. From the implementation point of view, it is beneficial to sample at least 4 μs in order to get an average with a small enough statistical fluctuation. The length of the time window in which the measurement is made can be longer; e.g., it can be selected to correspond to the tail symbol duration (i.e., three symbols which have a duration of (48/13)*13 μs=11 μs). This is the maximum time to get power measurement samples to average in software. In EDGE, as already noted, during the tail symbols there is only phase modulation but no amplitude modulation, which then enables the sample-measurements for a constant envelope.

FIG. 1 shows a schematic circuit controlling the output power of an amplifier 102. An input signal $S_{in}$ with an initial power $P_{in}$ is sent to the amplifier 102 which outputs a signal $S_{out}$ with output power $P_{out}$. The reference power level $P_{out, meas}$ corresponding to the output power $P_{out}$ is also obtained from the amplifier 102. A voltage $V_{out}$ corresponding to the reference power level $P_{out, meas}$ is detected and fed to a comparator 112. The comparator 112 compares the voltage $V_{out}$ with a reference $V_{ref}$ which represents the value of voltage $V_{out}$ which should be detected when the amplification is performed correctly. The comparator 112 produces as its output detected signal ΔV which is then led to an analog to digital converter ADC 118 which converts the detected signal ΔV into a digitized value SΔV.

The ADC 118 passes the digitized value SΔV to a comparator 122. The comparator 122 compares the digitised value SΔV with a predetermined threshold value. The comparator 122 passes the comparison result CR to the controller 124.

The controller 124 reads an old target power level $PL_{old\ target}$ from register 120. If the comparison result CR shows that the output voltage $V_{out}$ deviates from the reference voltage $V_{ref}$ more than a predefined threshold value, ion that the norm calculated for the digitized value SΔV is larger than the predefined threshold value, the controller 124 controls the amplifier 102 by adjusting the value of a control signal $V_{control}$. The controller 124 also writes a new target power level value $PL_{new\ target}$ into the register 120.

Main timer 114 provides a signal RS that is used in the controller 124 and in a counter 116 for timing purposes. The counter 116 changes the position of the switch SW1 by sending a control signal CS according to instructions SW it has obtained from the controller 124. The switch SW1 switches between the amplifier output T1 and terminal T2, and connects the amplifier output T1 or the terminal T2 to the terminal T3. The terminal T2 may be grounded; hence, the value of the detected signal ΔV can be easily estimated.

The system may be implemented using computer software in such a way that the sampling performed by the ADC 118 is triggered in terms of bits in a burst, the transmission of which is to be controlled, and then timed by a clock used for the microprocessor wherein the computer code is executed. The timing may be based on a GSM timer unit in base band, for example, if the amplifier is a GSM amplifier.

Figure 2:
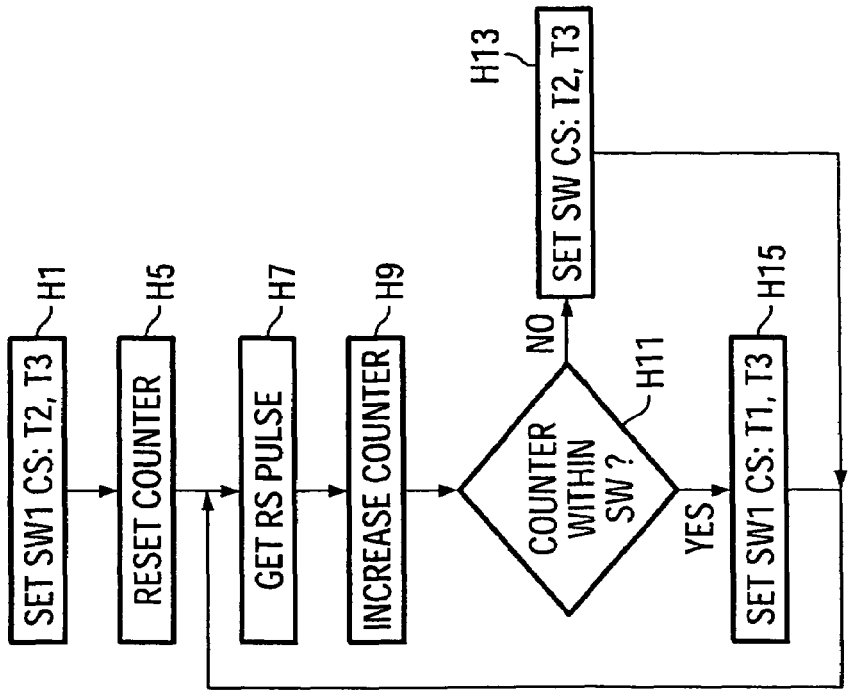
FIG. 2 illustrates a flow diagram showing the operation of the controller 124.

FIG. 2 illustrates the operation of the controller 124 in more detail. If the system is implemented using a software code which is executed in a microprocessor, then this is preferably performed as a process in the microprocessor. In step G1, a time window (or monitoring window) is defined. Within this time window the ADC 118 samples the detector signal.

The position of the switch SW1 may be changed by the counter 116. Further, a time delay TD relating to the system can be set up and burst timing defined. After defining the time windows, the number of clock cycles corresponding to the duration or moment of each operation is calculated in step G3. For a software implementation, the positions of time windows SWX1, SWX2, . . . are chosen and defined in bits nor steps with reference to the system timer.

In step G5, the instructions about the time windows SWX1, SWX2, . . . are stored into register 120 and, correspondingly, in step G7 the instructions about the time windows SWX1, SWX2, . . . are stored into the system timer 116 which may be a local oscillator or use the main timer 114 for timing purposes. The system timer 116 also may be a counter implemented by computer software. The steps G1 to G7 are performed before the controller 124 starts controlling the amplifier 102; e.g., in the manufacturing or design stage of a mobile terminal. Different instructions can be computed and stored when deemed necessary, such as if the timing changes, for example, which might be the case of a multi-bond terminal.

In step G9, the controller 124 receives the control signal CR from the comparator 122 which can correspond to a routine run in the software, for example. In step G11, the controller 124 checks whether there is a need to adjust the power level.

If the result of the comparison shows that the power level value PL has to be adjusted, the power level value PL is computed in step G13, and it is stored into the register 120 as the new target power level $PL_{new\ target}$ in step G14. After storing the power level value PL in step G14, the control signal $V_{control}$ is adjusted in step G16 corresponding to the power level value PL when needed; i.e., when a burst using the same power is commanded.

If the result of the comparison in step G11 shows that there is no need to adjust the power level PL, the control signal $V_{control}$ is adjusted in step G16 just to ensure that the control signal $V_{control}$ value is appropriate. In this case, after adjusting or checking the control signal $V_{control}$ value in step G16, the control returns to step G9 for obtaining new comparison results CR.

FIG. 3 illustrates the operation of the timing process in system timer 116. In step H1, the control signal CS is set to trigger the ADC to sample voltage $V_{out}$. In step H5, a counter variable is reset. The system timer 116 then receives a signal RS from the main timer 114 which may correspond, for example, to a local oscillator. The counter variable is increased in step edge H9 corresponding to the signal RS detected in step H7. In step H11, it is examined whether the counter parameter is between the values presenting moments in time SWX10N and SWX10FF for opening and closing the time window SWX1, or SWX20N and SWX20FF for opening and closing the time window SWX2, respectively, which already have been determined in step G3.

If the counter parameter is between values SWX10N and SWX10FF (i.e., within the time window SWX1) the control is passed to step H15 where the control signal CS is modified so that the switch SW1 connects the comparator 112 output T1 and T3. The control then returns to step H7; i.e., a next signal RS is counted. A similar process is performed if the counter parameter lies in the time window SWX2; i.e., between SWX20N and SWX20FF.

If the counter parameter does not fall between any of these two parameter pair values, then in step H13 the control signal CS is checked and adjusted, if necessary, to ensure that the switch SW1 connects the terminals T2 and T3. After this, the control is returned to step H7 for collecting a new signal RS.

Figures 5A, 5B:
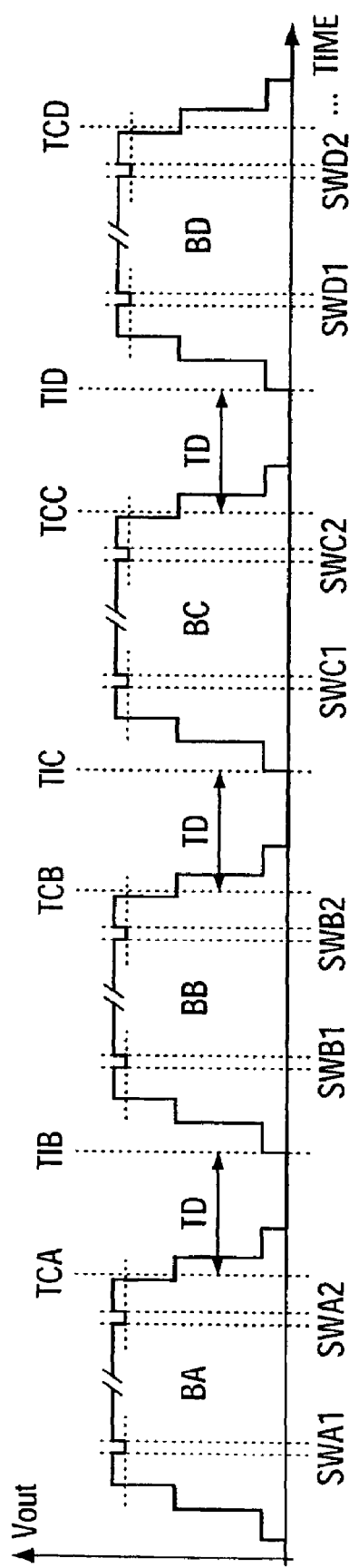
FIG. 5A shows the relation of subsequent bursts, the output signal values measured from them, and the timing of the control signals.
FIG. 5B shows a table illustrating the data in the controller 124.

FIG. 5A illustrates subsequent data bursts BA, BB, BC and BD. The envelope of each of the data bursts BA to BD is similar to the envelope of the data burst presented in FIG. 4. In the first data burst BA, there are two time windows SWA1, SWA2 used for selecting a part of the reference power level $P_{out,\ meas}$ to obtain the detected signal ΔV in the first data burst BA. The digitized value SΔV of the detected signal ΔV is used in the comparator 122 when comparing the digitized value SΔV against a predetermined threshold value.

In FIG. 5A, there are only four data bursts BA to BD presented. In principle, however, the data bursts extend all over the transmission period. In the FIG. 5A, TCA, TCB, TCC and TCD illustrate moments in time at which the controller 124 is ready with the comparing step G11 and the steps G13 and G14 are being completed. This is usually a bit later than any of the corresponding time windows (SWA1, SWA2 for TCA; SWB1, SWB2 for TCB; SWC1, SWC2 for TCC; and SWD1, SWD2 for TCD) because the processing of the information by the comparator 112, ADC 118, comparator 122, and controller 124 requires some time.

Time delay TD shows the delay between the beginning (TIB, TIC, TID) of the subsequent data burst (BB, BC, BD) and the moment in time (TCA, TCB, TCC) at which a control signal $V_{control}$ for the previous burst (BA, BB, BC, respectively) has been determined. It also illustrates that in step G16 the adjustment of the control signal $V_{control}$ must be delayed in the controller 124. Delaying must be done because the amplitude of an 8PSK modulated burst may not be altered within the burst because it might corrupt some data contained in the amplitude, for example. Hence, the now control signal $V_{control}$ obtained at the moment in time TCA must be used at a later point in time (i.e., at the beginning of a subsequent burst (BB, BC, BD), the controlling point in time being then TIB, TIC or TID, correspondingly. Preferably, in order to avoid sending a large number of data bursts BB, BC, BD, each being broadcast with a wrong power level, the subsequent burst before the beginning of which the correction to the amplifier 102 is sent is the next data burst BB.

FIG. 5B is a table showing some measurement values for the voltage $V_{out}$ during sequential data bursts at time windows SWX1 and SWX2 corresponding to time windows SWA1, SWA2, SWB1, SWB2, and so forth. For X=A, the average value during the time window SWA1 of the voltage $V_{out}$ is 0.25 V, whereas the reference voltage $V_{ref}$=0.24 V. In the second time window SWA2 the voltage $V_{out}$=0.26 V. The computed average of the different voltages $V_{out}$ differs from the reference voltage $V_{ref}$ 0.015 V. This corresponds to a 6.3% excess with respect to the reference voltage $V_{ref}$. If the initial value of the control signal $V_{control}$ passed to the amplifier 102 were 5 V for this burst, it would have to be decreased by 6.3%, the new value being 4.67 V. The control signal $V_{control}$ is changed in step G16 in the controller 124.

For the next data burst BB (for which X=B) during the time mask SWB1 the voltage $V_{out}$ 0.24 V is measured, and for SWB2 the voltage $V_{out}$ of 0.25 V is measured. The reference voltage $V_{ref}$ is again constant 0.24 V and the average calculated from both voltages $V_{out}$ measured at time windows SWB1 and SWBV2 values differs 5 mV from the reference voltage $V_{ref}$. The old power level value $PL_{control,\ old}$ equals 4.67 volts for this burst and the new power level value $PL_{control,\ new}$ has to be given a value of 2.1% less for the next data burst. Control signal $V_{control}$ is again changed after the time delay TD lapses (i.e., the controller 124 has a delay between the obtaining the new control signal $V_{control}$ for the next burst BC, and the actual changing of the control signal $V_{control}$ in the amplifier 102 which takes place at the beginning of the subsequent delta burst TIC). This causes a corresponding charge for the output power $P_{out}$ of the data burst BC, and so forth.

Figure 6:
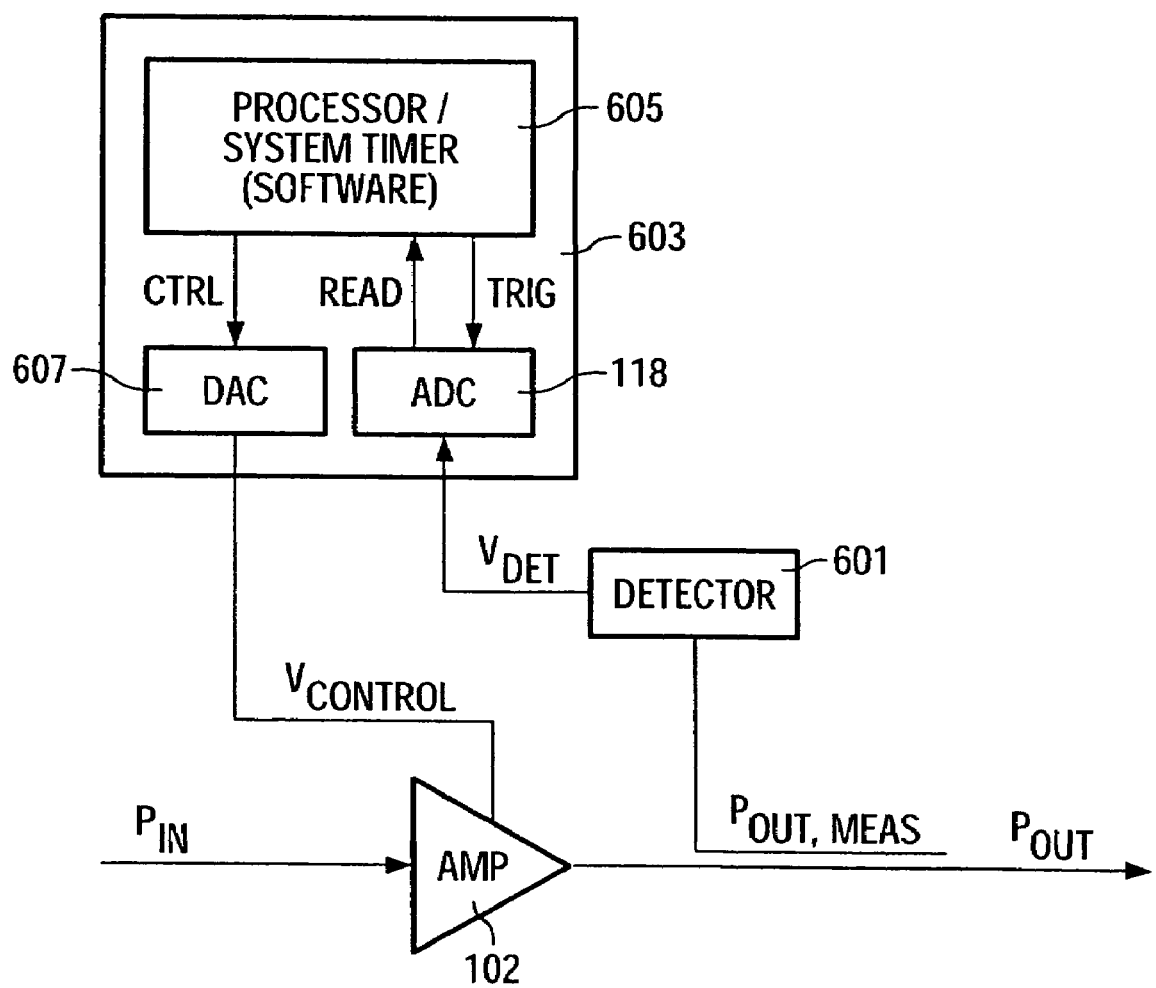
FIG. 6 illustrates an embodiment of the present invention implemented to be used in a microprocessor.

FIG. 6 illustrates an embodiment of the present invention implemented for use in a microprocessor; for example, with the help of software code. The amplifier 102 receives a signal $S_{in}$ with initial power $P_{in}$ and amplifies it to an output signal $S_{out}$ having an output power $P_{out}$. A reference power level $P_{out,\ meas}$ presenting the output power $P_{out}$ of the signal $S_{out}$ is collected using a sensor, such as a coupler, and fed to a detector 601. The detector 601 outputs a detector voltage $V_{det}$ being responsive to the reference power level $P_{out}$. The detector voltage $V_{det}$ is passed to the processing block 603 which includes analog-to-digital convert ADC 118, processor/system timer 605 and a digital-to-analog converter DAC 607.

The processor/system timer 605 triggers the ADC 118, and digitized values of $V_{det}$ are read to the analyzer means in the processor/system timer 605. The processor/system timer 605 analyzers and controls the control voltage $V_{control}$. The controlling is performed so that the processor/system timer 605 sends a control signal to the DAC 607 which then passes the analog control voltage $V_{control}$ to the amplifier 102.

More precisely, all tasks as described with reference to FIG. 1 also can be implemented using computer software. According to one embodiment of the present invention, such an implementation follows the guidelines discussed with reference to FIG. 6. The system includes an amplifier for amplifying a signal including data bursts. A sampled signal corresponding to the amplified signal is compared with a reference value. If the result of the comparison shows that the sampled signal differs more than a predefined threshold value from the reference value, a control signal of the amplifier is adjusted by the controller of the system.

The signal corresponding to the amplified signal is selected by a time window from a first data burst, and the controller is adapted to adjust the control signal of the amplifier to have an effect from the beginning of a subsequent data burst. This is particularly useful when the data bursts in question also include an amplitude modulation part because it saves a great deal of processing in getting an average value of the power.

In accordance with one embodiment of the present invention, the signal is during at least one time window located at an edge of the active burst. Preferably, this may be a ramp up or a ramp down position of the active burst. The top of up and down ramping periods in both 8PSK and GMSK, because of the tail symbols, has a constant envelope; i.e., no amplitude modulation.

In accordance with another embodiment of the present invention, the predetermined time delay corresponds to the time between obtaining the sample of the signal and the time at which the subsequent burst may begin. Preferably, the subsequent burst is the next burst to the burst for which the part of the signal was selected. In this way, the timing of the correction does not interfere with the possible amplitude modulation present in the burst being sent; i.e., that the correction is done for a whole burst, not for only a part of it.

The present invention can be utilized not only in mobile terminals, but also in any devices that include a transmitter transmitting a signal containing data bursts. Such a device may be a base station used in mobile networks, for example.

In addition, for example, the number and length of time windows may be different from 2 and 4 μs, and the delaying of the amplifier 102 control may take place in the ADC 118, in the comparator 122 or in the amplifier 102 instead of taking place in the controller 124. Eventually, the comparator can be an operational amplifier and a switch controlled by a timer can sample voltage $V_{out}$.

Although the present invention has been described with reference to specific embodiments, those of skill in the art will recognize that changes may be made thereto without departing from the spirit and scope of the present invention as set forth in the hereafter appended claims.

The invention claimed is:

1. A power control system for a radio transmitter transmitting a radio signal modulated with non-constant envelope modulation, comprising:
    an amplifier that amplifies a signal comprising data bursts;
    parts for obtaining a first voltage corresponding to a power of the amplified signal;
    time masking parts that select at least one time window during which tail symbols of a first data burst are sent, wherein said time window has a predetermined length, and is located at one of a beginning and an end of the time during which the payload data are sent, and wherein the non-constant-envelope modulation is made more constant;
    parts for measuring the first voltage only during the at least one time window selected by the time masking parts;
    a comparator for comparing the first voltage with a reference voltage and producing a comparison result; and
    a controller, responsive to the comparator, that adjusts a control signal of the amplifier after a predetermined time delay, occurring after the time window selected by the time masking parts has lapsed, if the comparison result indicates that the first voltage deviates more than a predefined threshold value from the reference voltage.

2. A power control system for a radio transmitter as claimed in claim 1, wherein the time masking parts select a time window located at an edge of an active burst.

3. A power control system for a radio transmitter as claimed in claim 2, wherein the edge is in one of a ramp up position and a ramp down position of the active burst.

4. A power control system for a radio transmitter as claimed in claim 1, wherein the predetermined time delay corresponds to a delay between a moment in time at which a value of the control signal is obtained and a time at which a subsequent data burst begins.

5. A power control system for a radio transmitter as claimed in claim 4, wherein the subsequent data burst is a next data burst to the first data burst for which the first voltage was measured.

6. A power control system for a radio transmitter as claimed in claim 1, wherein the predefined length of the at least one timing window is approximately 4 microseconds.

7. A power control system for a radio transmitter as claimed in claim 1, wherein the predefined length of the at least one timing window is variable.

8. A power control system for a radio transmitter as claimed in claim 1, wherein at least one of the time masking parts and the controller are at least partially implemented using software code run in a processor.

9. A power control system for a radio transmitter as claimed in claim 1, wherein the power control system is implemented in a mobile terminal.

10. A power control system for a radio transmitter as claimed in claim 1, wherein the power control system is implemented in a base station terminal.

11. A method for power control in a radio transmitter transmitting a radio signal modulated with non-constant envelope modulation, the method comprising the steps of:
    amplifying a signal to result in an amplified signal, the amplified signal including data bursts;
    obtaining a first voltage which corresponds to an output power of the amplified signal;

performing time masking to select at least one time window during which tail symbols of a first data burst are to be sent, wherein the time window has a predetermined length and is located at one of a beginning and an end of the time during which the payload data are sent, and wherein the non-constant-envelope modulation is made more constant;

measuring the first voltage, only in the at least one time window selected by the time masking with the predefined length, of the first data burst to be used for a comparison;

comparing the first voltage with a reference voltage and producing a comparison result; and adjusting a control signal used in the amplifying step after a predetermined time delay, occurring after the time window has lapsed, if the comparison result indicates that the voltage deviates more than a predetermined threshold value from the reference voltage.

12. A method for power control in a radio transmitter as claimed in claim 11, wherein the step of selecting comprises selecting a time window located at an edge of an active data burst.

13. A method for power control in a radio transmitter as claimed in claim 12, wherein the edge is in one of a ramp up position and a ramp down position of the active data burst.

14. A method for power control in a radio transmitter as claimed in claim 11, wherein the predetermined time delay corresponds to a time between determining the control signal and a time at which a subsequent data burst begins.

15. A method for power control in a radio transmitter as claimed in claim 14, wherein the subsequent data burst is a next burst to the first data burst for which the first voltage was measured.

16. A method for power control in a radio transmitter as claimed in claim 11, wherein the predefined length of the at least one timing window is approximately 4 microseconds.

17. A method for power control in a radio transmitter as claimed in claim 11, wherein the predefined length of the at least one timing windows is variable.

18. A method for power control in a radio transmitter as claimed in claim 11, wherein at least one of the step of comparing and the step of adjusting is at least partially implemented using software code.

19. A method for power control in a radio transmitter as claimed in claim 11, wherein the method for power control is implemented in a mobile terminal.

20. A method for power control in a radio transmitter as claimed in claim 11, wherein the method for power control is implemented in a base station terminal.

21. A method for power control in a radio transmitter transmitting a radio signal modulated with non-constant envelope modulation, the method comprising the steps of:

performing time masking on a signal having data bursts to select at least one time window during which tail symbols of a first data burst are sent, wherein the time window has a predetermined length and is located at one of a beginning and an end of the time during which the payload data are sent, and wherein the non-constant-envelope modulation is made more constant;

measuring a first voltage corresponding to the output power of the signal only in the at least one time window selected by the time masking;

comparing the first voltage with a reference voltage and producing a comparison result; and adjusting a control signal used in the amplifying step after a predetermined time delay, occurring after the time window has lapsed, if the comparison result indicates that the voltage deviates more than a predetermined threshold value from the reference voltage.

* * * * *